United States Patent
Chao et al.

(10) Patent No.: US 8,426,922 B2
(45) Date of Patent: Apr. 23, 2013

(54) CMOS STRUCTURE AND LATCH-UP PREVENTING METHOD OF SAME

(75) Inventors: Fang-Mei Chao, Taichung (TW); Ming-I Chen, Hsinchu (TW); Ying-Ko Chin, Hsinchu (TW); Yi-Chiao Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 160 days.

(21) Appl. No.: 12/905,837

(22) Filed: Oct. 15, 2010

(65) Prior Publication Data

US 2012/0091536 A1   Apr. 19, 2012

(51) Int. Cl.
*H01L 23/62* (2006.01)
*H01L 21/70* (2006.01)

(52) U.S. Cl.
USPC ............ 257/357; 257/369; 257/E21.632; 438/199

(58) Field of Classification Search ......... 257/357, 257/372; 438/414, 220
See application file for complete search history.

(56) References Cited

U.S. PATENT DOCUMENTS

| | | | | |
|---|---|---|---|---|
| 5,880,502 A | * | 3/1999 | Lee et al. | 257/372 |
| 6,495,888 B1 | * | 12/2002 | Yamato | 257/355 |
| 2008/0017906 A1 | * | 1/2008 | Pelella et al. | 257/306 |
| 2008/0124884 A1 | * | 5/2008 | Pelella et al. | 438/380 |
| 2008/0197416 A1 | * | 8/2008 | Takahashi | 257/357 |

OTHER PUBLICATIONS

Felipe Coyotl Mixcoatl1, Alfonso Torres Jacome; Latchup prevention by using guard ring structures in a 0.8 μm bulk CMOS process; Superficies y Vacio 17(4), Dec. 17-22, 2004; pp. 17-23; Tonantzintla, Puebla, México.

* cited by examiner

*Primary Examiner* — Michelle Mandala
*Assistant Examiner* — Shaka White
(74) *Attorney, Agent, or Firm* — Ding Yu Tan

(57) ABSTRACT

A CMOS structure includes a PMOS portion and an NMOS portion isolated from each other via a P-well region disposed next to the PMOS portion and an N-well region disposed between the P-well region and the NMOS portion, an insulation layer overlying at least the N-well region, and a pad structure disposed over the N-well region. The pad structure further includes: a pad body disposed on the insulation layer; and at least one contact plug penetrating through the insulation layer, having one end coupled to the pad body and the other end coupled to a contact zone in the N-well region; wherein the contact zone is interfaced with the N-well region with P-type dopants.

12 Claims, 3 Drawing Sheets

CMOS STRUCTURE AND LATCH-UP PREVENTING METHOD OF SAME

BACKGROUND

1. Technical Field

The present invention relates to a CMOS structure, and more particularly to a CMOS structure with minimized latch-up. The present invention also relates to a method for reducing latch-up effect of a CMOS IC.

2. Description of the Related Art

A so-called latch-up effect commonly occurs in an integrated circuit (IC) such as a complementary metal oxide semiconductor (CMOS) device. Latch-up might damage the IC as causing the creation of a PNPN path through which a high current is generated. CMOS device manufacturers have been endeavoring to ameliorate the latch-up effect.

Please refer to FIG. 1A, which schematically illustrates a CMOS IC in a cross-sectional view. As shown, a pad 14 for an input pin 15 is coupled between a PMOS portion 10 and an NMOS portion 18 via a P-well region 12 and an N-well region 13. With such a configuration, a path originating from VDD and passing through the P+ region 100 in the PMOS portion 10, another N-well 11 underneath the PMOS circuit, the P-well 12 and the N-well 13, which is a PNPN path, may be conducted and undesirable reach the pad 14. When the input pin 15 is at a low level, a high current likely flows through the above-described path and the latch-up effect is thus rendered. For ameliorating the damage, an improved CMOS IC structure is shown in FIG. 1B in a cross-sectional view. As shown, a P+ region 19 is additionally provided above the P-well region 12. Accordingly, a high current, if occurring, can be drained through the P+ region 19 so as to avoid latch-up.

The above solution, unfortunately, cannot be applied to a CMOS IC manufacturing process involving a so-called 1P1M process, i.e. one poly one metal process, since there is no way to form a conductor capable of connecting the P+ region 19 to the external.

BRIEF SUMMARY

Therefore, the present invention provides a CMOS structure with minimized latch-up effect.

The present invention also relates to a method for preventing a CMOS IC from a latch-up effect.

The present invention provides a CMOS structure includes a PMOS portion and an NMOS portion isolated from each other via a P-well region disposed next to the PMOS portion and an N-well region disposed between the P-well region and the NMOS portion, an insulation layer overlying at least the N-well region, and a pad structure disposed over the N-well region. The pad structure further includes: a pad body disposed on the insulation layer; and at least one contact plug penetrating through the insulation layer, having one end coupled to the pad body and the other end coupled to a contact zone in the N-well region; wherein the contact zone is interfaced with the N-well region with P-type dopants.

The present invention also provides a method for preventing a CMOS IC from a latch-up effect. The CMOS IC has a base structure including a PMOS portion and an NMOS portion isolated from each other via a P-well region disposed next to the PMOS portion and an N-well region disposed between the P-well region and the NMOS portion. The method includes: forming an insulation layer overlying the base structure; creating at least one contact hole penetrating through the insulation layer; performing an implantation process to provide P-type dopants as an outer area of a contact zone for interfacing an inner area of the contact zone with the N-well region; forming at least one contact plug in the at least one contact hole, the at least one contact plug having one end coupled to the contact zone; and forming a pad body on the insulation layer, coupled to the other end of the at least one contact plug.

In an embodiment, the implantation process is performed before the insulation layer is formed.

In another embodiment, the implantation process is performed with the insulation layer created with the at least one contact hole as a mask.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items.

Figure 1A:
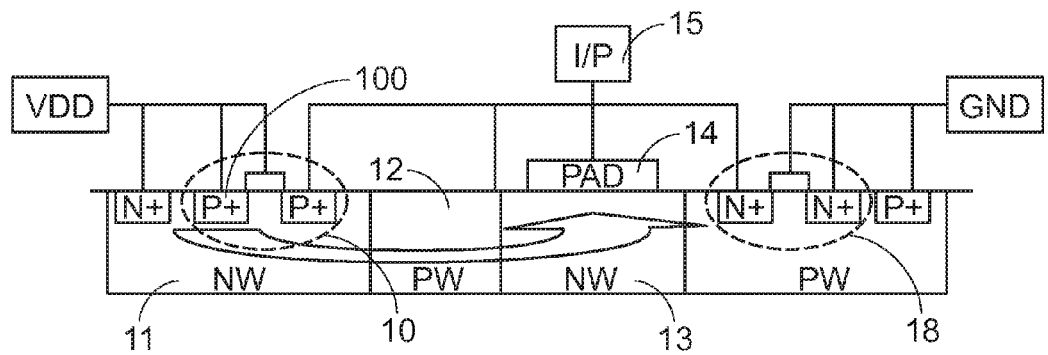
FIG. 1A is a cross-sectional view schematically illustrating a conventional CMOS structure.
Figure 1B:
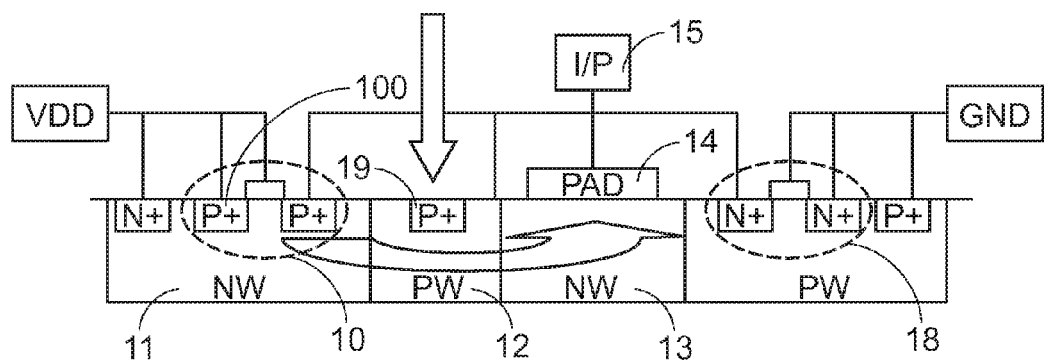
FIG. 1B is a cross-sectional view schematically illustrating another conventional CMOS structure.
Figure 2A:
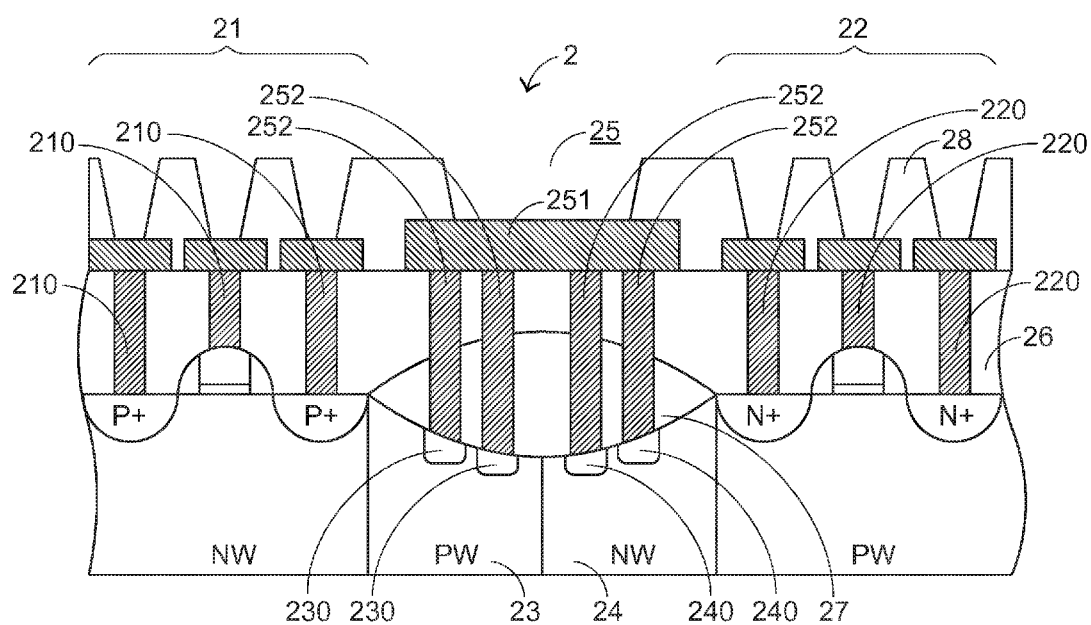
FIG. 2A is a cross-sectional view schematically illustrating a CMOS structure according to an embodiment of the present invention.

Please refer to FIG. 2A, which schematically illustrates a CMOS structure according to an embodiment of the present invention in a cross-sectional view. As shown, the CMOS structure 2 includes a PMOS portion 21 and an NMOS portion 22, which are isolated with each other via a P-well region 23 and an N-well region 24. A pad structure 25 is formed in an isolation region 27 between the PMOS portion 21 and NMOS portion 22, and includes a pad body 251 and a plurality of contact plugs 252. The pad body 251 is disposed on an insulation layer 26 and mounted to contact zones 230 and 240 respectively in the P-well region 23 and N-well region 24 with the contact plugs 252. The contact plugs 252 penetrates through the insulation layer 26, which is an inter-layer dielectric layer, and the field oxide layer in the isolation region 27 and ends at the contact zones 230 and 240 for supporting and securing the pad body 251. The CMOS structure further includes a passivation layer 28 overlying the resulting structure for protection and created with openings for wire-bonding.

Figure 2B:
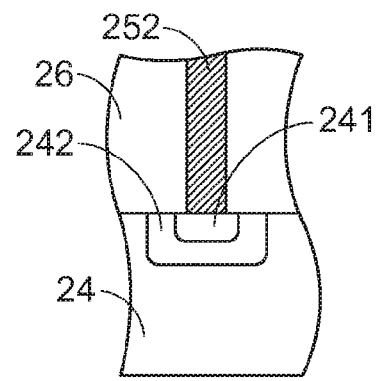
FIG. 2B is a view schematically showing a part of the structure of FIG. 2A.

FIG. 2B schematically illustrates a partial CMOS structure, focused in the contact zone 240. Generally, the definition of contact holes for forming the contact plugs 252 and for other contact plugs 220 are performed with the same mask. Therefore, implantation required by the contact plugs 220 also causes dopants introduced into the isolation region 27 so as to form the contact zones 240 in the N-well region 24, and the dopant concentration in the area 241 is higher than that in other area in the N-well region, 24. The presence of the area 241 connects a PNPN path. For cutting the PNPN path, another dopant area 242 surrounding the dopant area 241 is provided according to an embodiment of the present invention, and the types of dopants in the area 242 are made different from that in the area 241. Since the dopants in the area 241 is of N type, the dopants in the area 242 is of P type. Boron is one of the dopant examples. The P-type dopant area 242 isolates the N-type dopant area from forming the PNPN path so as to avoid latch-up effect.

The formation of the dopant area 242 can be implemented in a variety of ways. The process of forming the dopant area 242 may be independently performed or integrated with another existing process during the formation of the CMOS structure. For example, it can be performed accompanying the code implantation process of a ROM without additional implanting procedure. In more detail, the process of forming the dopant area 242 as well as the code implantation process may be performed after the formation of the PMOS and NMOS portions 21 and 22 but prior to the formation of the insulation layer 26.

Figure 3A:
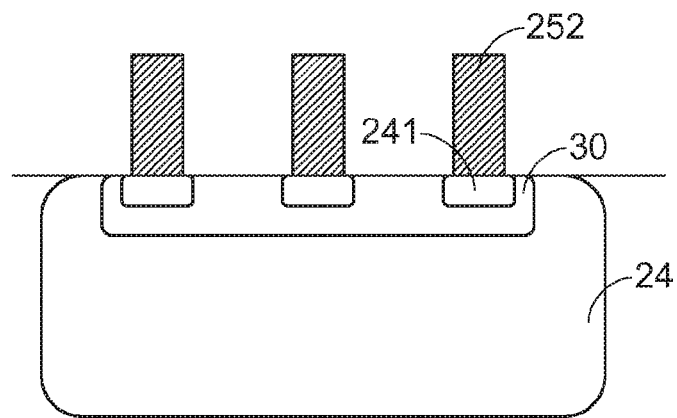
FIG. 3A and FIG. 3B are cross-sectional views schematically illustrating a part of a CMOS structure according to embodiments of the present invention.
Figure 3B:
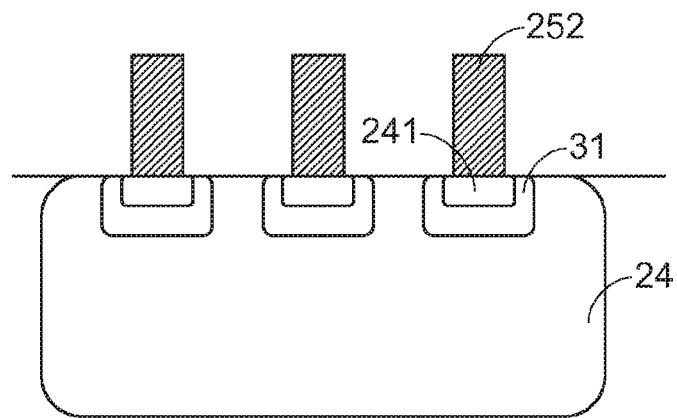

In an embodiment, the implantation process is performed after the formation of the PMOS and NMOS portions 21 and 22 but before the insulation layer 26 is applied. The implantation results in a dopant area 30 continuously extending over the isolation region and covering the previously doped area 241 as a whole, as illustrated in FIG. 3A. In an alternative embodiment, the implantation process is performed after the insulation layer 26 is applied and patterned to create contact holes therein. With the insulation layer 26 created with the contact holes as a mask, a dopant area 31 resulting from the implantation separately covers each of the previously doped area 241, as illustrated in FIG. 3B.

It is understood from the above descriptions that by cutting the PNPN path with additional dopants, latch-up effect resulting from a high current flowing through the PNPN path can be prevented from. The dopant species and concentration and the energy of implantation may vary with practical requirements as long as the PNPN path can be successfully cut or hindered by the dopants.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A CMOS structure, comprising a PMOS portion and an NMOS portion isolated from each other via a P-well region disposed next to the PMOS portion and an N-well region disposed next to the P-well region and the NMOS portion respectively, an insulation layer overlying at least the N-well region, and a pad structure disposed over the N-well region, the pad structure further comprising:
   a pad body disposed on the insulation layer; and
   at least one contact plug penetrating through the insulation layer, having one end coupled to the pad body and the other end coupled to a contact zone in the N-well region;
   wherein the contact zone interfaces the N-well region with P-type dopants, the contact zone includes an inner dopant area formed with N-type dopants and an outer dopant area formed with the P-type dopants.

2. The CMOS structure according to claim 1 wherein the insulation layer overlies the PMOS portion, the NMOS portion, the P-well region and the N-well region.

3. The CMOS structure according to claim 1 wherein the insulation layer is an inter-layer dielectric layer.

4. The CMOS structure according to claim 1 wherein the at least one contact plug further penetrates through a field oxide layer disposed between the insulation layer and the N-well region.

5. The CMOS structure according to claim 1 wherein the P-type dopants are boron.

6. The CMOS structure according to claim 1 wherein the at least one contact plug is formed of metal.

7. The CMOS structure according to claim 1 comprising a plurality of the contact plugs, wherein the outer dopant area are separately disposed under the plurality of the contact plugs.

8. The CMOS structure according to claim 1 comprising a plurality of the contact plugs, wherein the outer dopant area continuously extends under the plurality of the contact plugs.

9. A method for preventing a CMOS IC from a latch-up effect, the CMOS IC having a base structure including a PMOS portion and an NMOS portion isolated from each other via a P-well region disposed next to the PMOS portion and an N-well region disposed next to the P-well region and the NMOS portion respectively, the method comprising:
   forming an insulation layer overlying the base structure;
   creating at least one contact hole penetrating through the insulation layer;
   performing an implantation process to provide P-type dopants as an outer area of a contact zone for interfacing an inner area of the contact zone with the N-well region, wherein the inner area of the contact zone is previously implanted with N-type dopants;
   forming at least one contact plug in the at least one contact hole, the at least one contact plug having one end coupled to the contact zone; and
   forming a pad body on the insulation layer, coupled to the other end of the at least one contact plug.

10. The method according to claim 9 wherein the implantation process is performed before the insulation layer is formed.

11. The method according to claim 9 wherein the implantation process is performed with the insulation layer created with the at least one contact hole as a mask.

12. The method according to claim 9 wherein the implantation process for providing the P-type dopants is a code implantation process of a ROM.

* * * * *